(12) United States Patent
Forbes

(10) Patent No.: US 8,304,818 B2
(45) Date of Patent: *Nov. 6, 2012

(54) DRAM ARRAYS, VERTICAL TRANSISTOR STRUCTURES, AND METHODS OF FORMING TRANSISTOR STRUCTURES AND DRAM ARRAYS

(75) Inventor: Leonard Forbes, Corvallis, OR (US)

(73) Assignee: Micron Technology Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/899,436

(22) Filed: Oct. 6, 2010

(65) Prior Publication Data

US 2011/0018045 A1    Jan. 27, 2011

Related U.S. Application Data

(62) Division of application No. 11/955,251, filed on Dec. 12, 2007, now Pat. No. 7,824,982.

(51) Int. Cl.
*H01L 27/108* (2006.01)

(52) U.S. Cl. ........ 257/266; 257/296; 257/314; 257/315; 257/316; 257/329; 257/401; 257/506

(58) Field of Classification Search .................. 257/266, 257/314, 315, 316, 401, 506
See application file for complete search history.

(56) References Cited

U.S. PATENT DOCUMENTS

| | | | |
|---|---|---|---|
| 5,017,977 A | 5/1991 | Richardson | |
| 5,989,961 A | 11/1999 | Yang et al. | |
| 6,150,687 A | 11/2000 | Noble et al. | |
| 6,246,083 B1 | 6/2001 | Noble | |
| 6,320,222 B1 | 11/2001 | Forbes et al. | |
| 6,689,660 B1 | 2/2004 | Noble et al. | |
| 7,285,812 B2 * | 10/2007 | Tang et al. | 257/296 |
| 7,288,809 B1 * | 10/2007 | Fastow et al. | 257/314 |
| 7,298,638 B2 * | 11/2007 | Forbes | 365/51 |
| 7,569,876 B2 * | 8/2009 | Forbes | 257/288 |
| 2003/0001290 A1 | 1/2003 | Nitayama et al. | |
| 2003/0049910 A1 * | 3/2003 | Forbes | 438/323 |
| 2004/0090816 A1 | 5/2004 | Forbes | |
| 2004/0108532 A1 | 6/2004 | Forbes | |

(Continued)

OTHER PUBLICATIONS

Cho et al., "A Novel Pillar DRAM Cell for 4 GBIT and Beyond", Center for Intergrated Systems, Stanford University, Standford, CA, (2 pages), Published in IEEE 1998, symposium on VLSI Technology, Honolulu, Hawaii, Jun. 9th and 11th, 1998.

(Continued)

*Primary Examiner* — Matthew W Such
*Assistant Examiner* — David Spalla
(74) *Attorney, Agent, or Firm* — Wells St. John P.S.

(57) ABSTRACT

The invention includes a method of forming a semiconductor construction. Dopant is implanted into the upper surface of a monocrystalline silicon substrate. The substrate is etched to form a plurality of trenches and cross-trenches which define a plurality of pillars. After the etching, dopant is implanted within the trenches to form a source/drain region that extends less than an entirety of the trench width. The invention includes a semiconductor construction having a bit line disposed within a semiconductor substrate below a first elevation. A wordline extends elevationally upward from the first elevation and substantially orthogonal relative to the bit line. A vertical transistor structure is associated with the wordline. The transistor structure has a channel region laterally surrounded by a gate layer and is horizontally offset relative to the bit line.

6 Claims, 13 Drawing Sheets

U.S. PATENT DOCUMENTS

| | | |
|---|---|---|
| 2004/0188737 A1 | 9/2004 | Chaudhry et al. |
| 2006/0001290 A1* | 1/2006 | Hammaker et al. ..... 296/146.15 |
| 2006/0125044 A1* | 6/2006 | Haller ........................ 257/506 |
| 2006/0273370 A1 | 12/2006 | Forbes |
| 2007/0018206 A1 | 1/2007 | Forbes |
| 2007/0066019 A1 | 3/2007 | Forbes |
| 2007/0114576 A1 | 5/2007 | Forbes |

OTHER PUBLICATIONS

Denton et al., "Fully Depleted Dual-Gated Thin-Film SOI P-MOSFET's Fabricated in SOI Islands with an Isolated Buried Polysilicon Backgate", IEEE Electron Device Letters, Nov. 1996, pp. 509-511, vol. 17, No. 11.

Doyle et al. "Tri-Gate fully-depleted CMOS transistors: fabrication, design and layout", 2003 Symposium on VLSI Technology, Digest of Technical Papers, Kyoto, Japan, Jun. 10-12, 2003 (Abstract Only).

Doyle et al., "High-performance fully-depleted tri-gate CMOS transistors", IEEE Electron Device Letters, vol. 24, No. 4, Apr. 2003 (Abstract only).

Endoh et al., "2. 4F2 Memory Cell Technology with Stacked-Surrounding Gate Transistor (S-SGT) DRAM", IEEE Transactions on Electron Devices, Aug. 2001, pp. 1599-1603, vol. 48, No. 8.

Endoh et al., "Novel Ultrahigh-Density Flash Memory with a Stacked-Surrounding Gate Transistor (S-SGT) Structured Cell", IEEE TRansactions on Electron Devices, Apr. 2003, pp. 945-951, vol. 50, No. 4.

Goebel et al., "Fully Depleted Surrounding Gate Transistor (SGT) for 70 nm DRAM and Beyond", Infineon Technical Presentations at IEDM, 2002, pp. 275-278.

Huang et al., "Sub-50 nm P-Channel FinFET", IEEE Ytansactions on Electron Devices, May 2001, pp. 880-886, vol. 48, No. 5.

Kedzierski et al., "High-performance symmetric-gate and CMOS-compatible Vt asymmetric-gate FinFET devices" Electron Devices Meeting, 2001, Conference Digest, 2001, pp. 19.51-19.5.4.

Miyano et al., "Numerical Analysis of a Cylindrical Thin-Pillar Transistor (Cynthia", IEEE Transactions on Electron Devices, Aug. 1992, vol. 39, No. 8, pp. 1876-1880.

Nitayama et al., "Multi-Pillar Surrounding Gate Transistors (M-SGT) for Compact and High-Speed Circuits", IEEE Transactions on Electron Devices, Mar. 1991, pp. 579-583, vol. 38, No. 3.

Shimomura et al., "A 1-V 46-ns 16-Mb SOL-DRAM with Body Control Technique", IEEE Journal of Solid-State Circuits, Nov. 1997, pp. 1712-1720, vol. 32, No. 11.

Sunouchi et al., "A Surrounding Gate Transistor (SGT) Cell for 64/256Mbit DRAMs" 1989 IEEE IEDM, Technical Digest, Washington DC, pp. 23-26, Dec. 1989.

Sunouchi et al., "A Surrounding Gate Transistor (SGT) Cell for 64/256Mbit DRAMs" 1989 IEEE IEDM, Technical Digest, Washington DC. pp. 23-26, Dec. 1989.

Takato et al., "High Performance CMOS Surrounding Gate Transistor (SGT) for Ultra High Density LSIs", IEDM Tech. Dig., pp. 222-225, 1988.

Takato et al., "High Performance CMOS Surrounding Gate Transistor (SGT) for Ultra High Density LSIs", IEDM Tech. Dig., pp. 222-225, 1998.

Terauchi et al., "A surrounding Gate Transistor (SGT) Gain Cell for Ultra High Density DRAMs", 1993 Symposium on VLSI Technology, Digest of Technical Papers, Kyoto Japan, pp. 21-22, 1993.

Wong et al., "Self-Aligned (Top and Bottom) Double-Gate MOSFET with a 25nm Thick Silicon Channel", Electron Devices Metting, 1997, pp. 427-430.

* cited by examiner

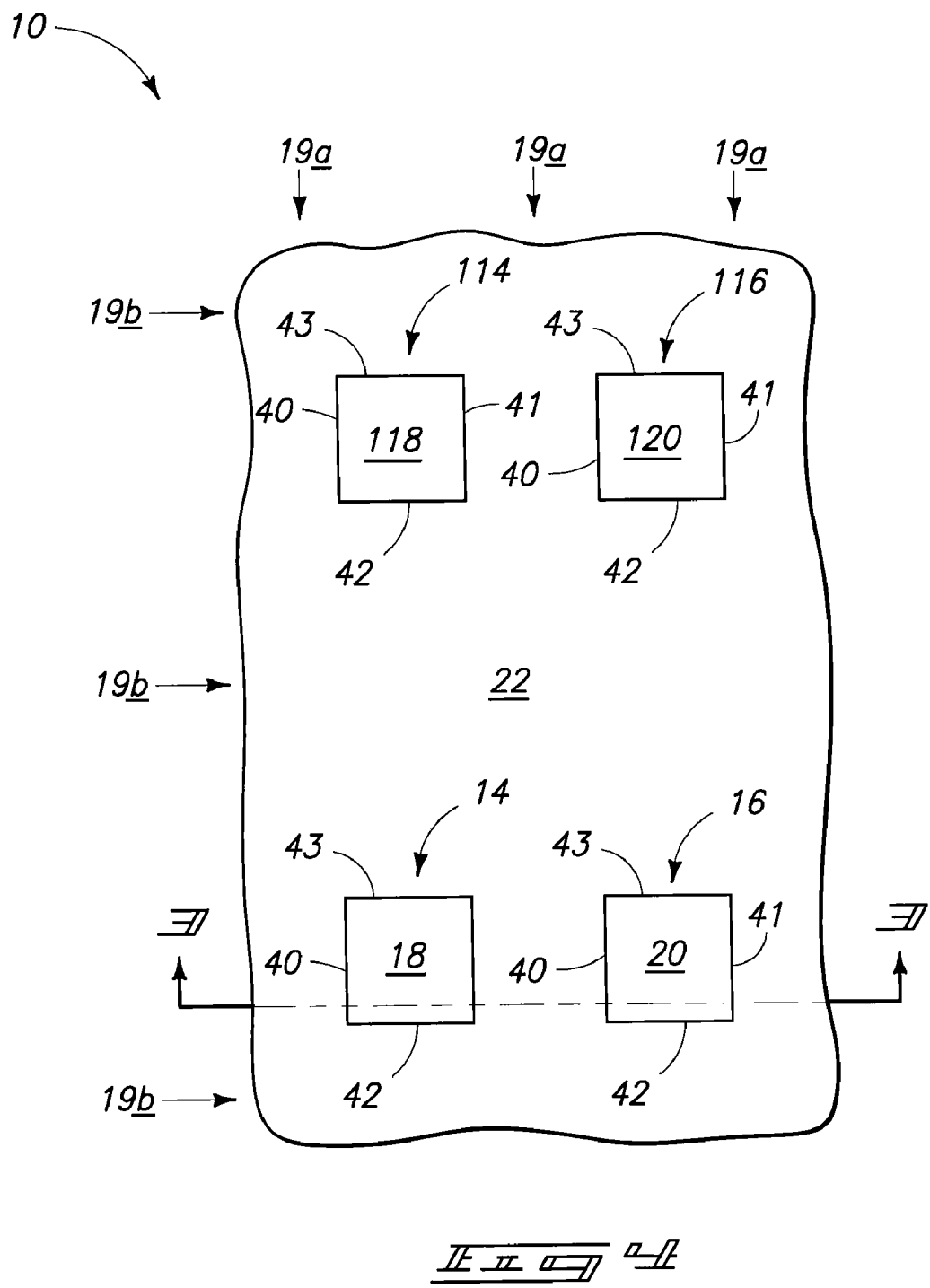

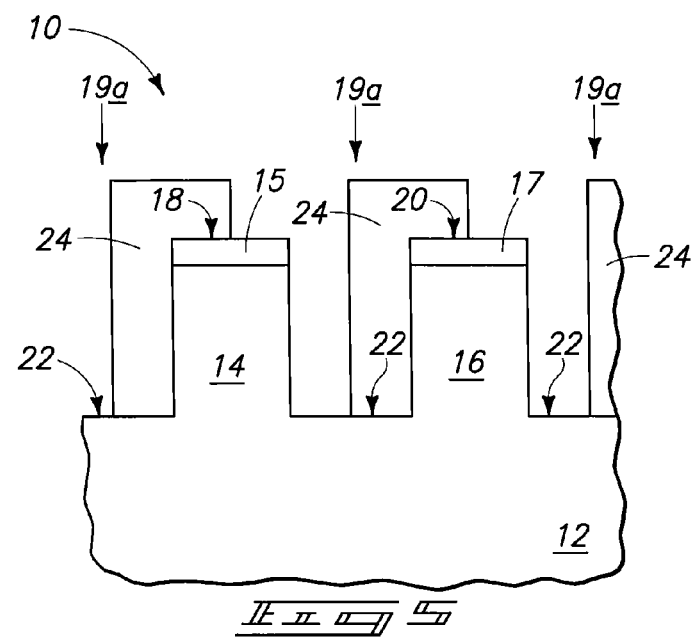
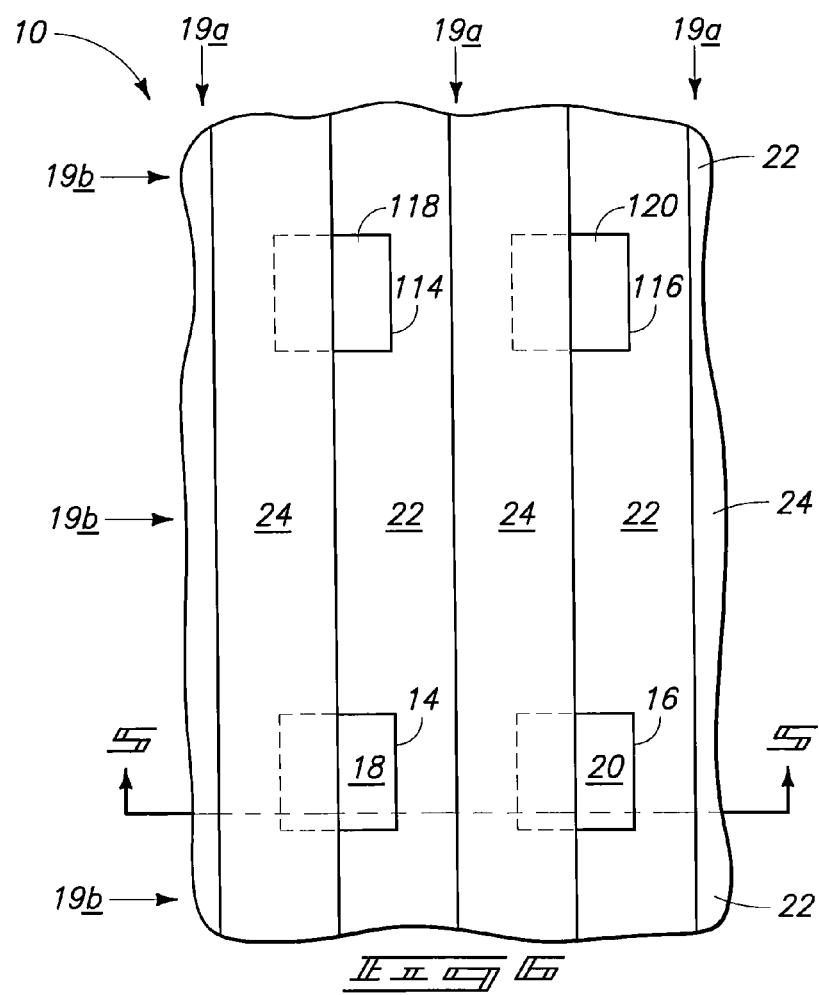

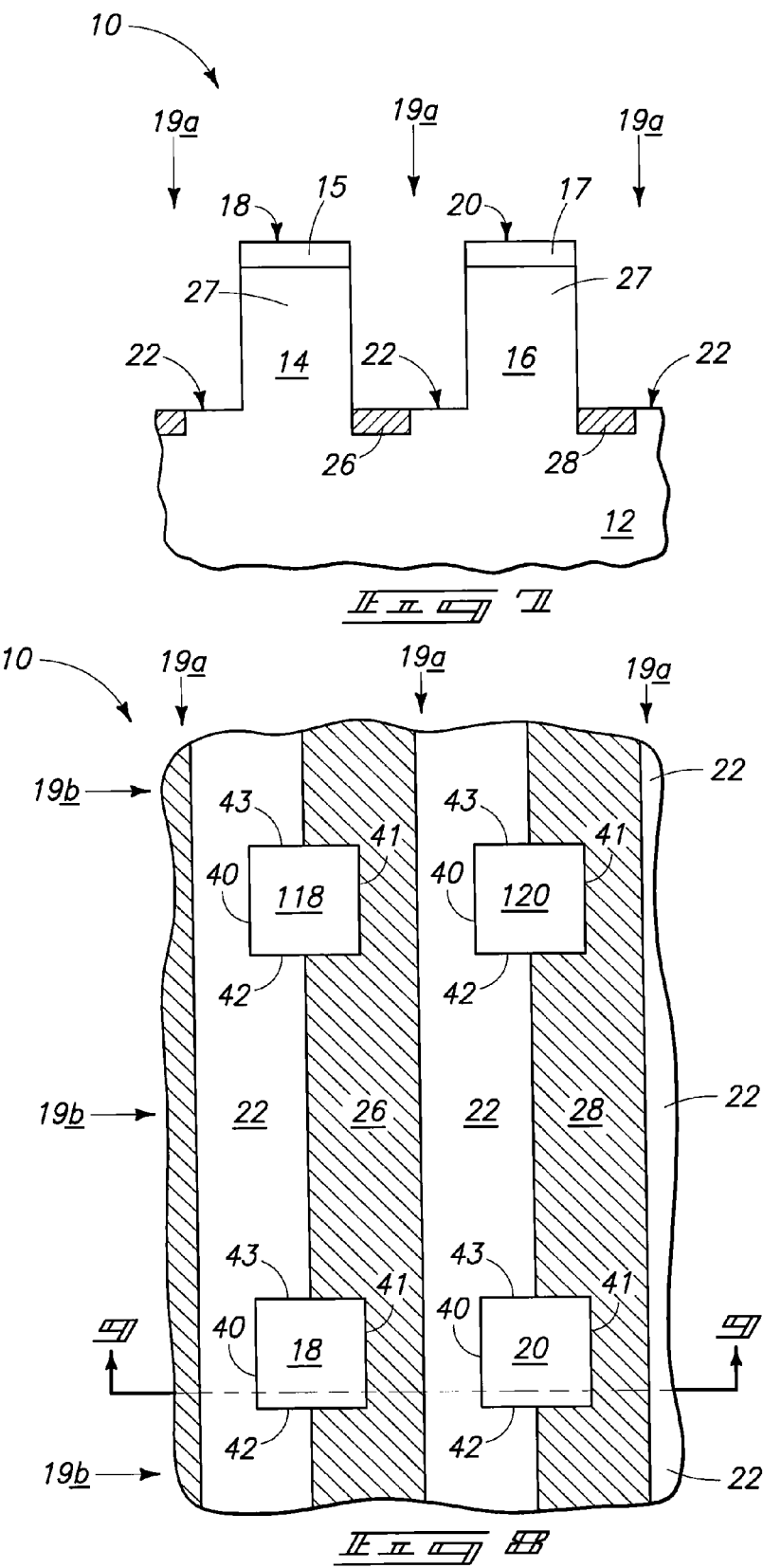

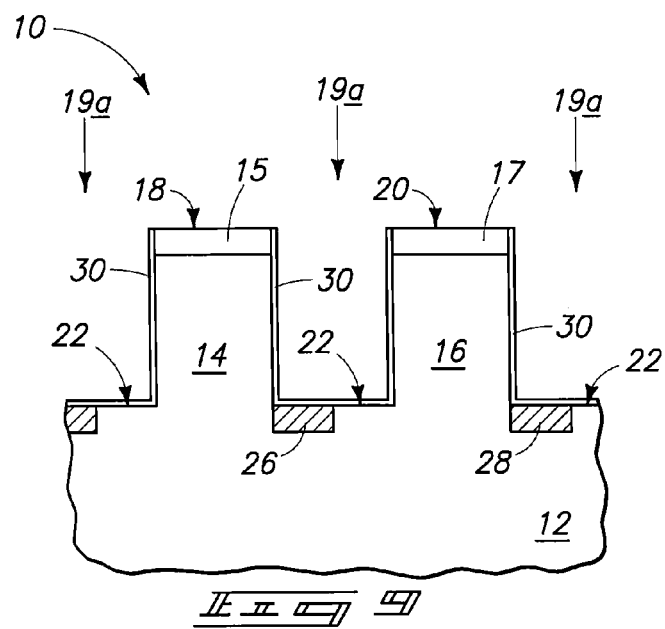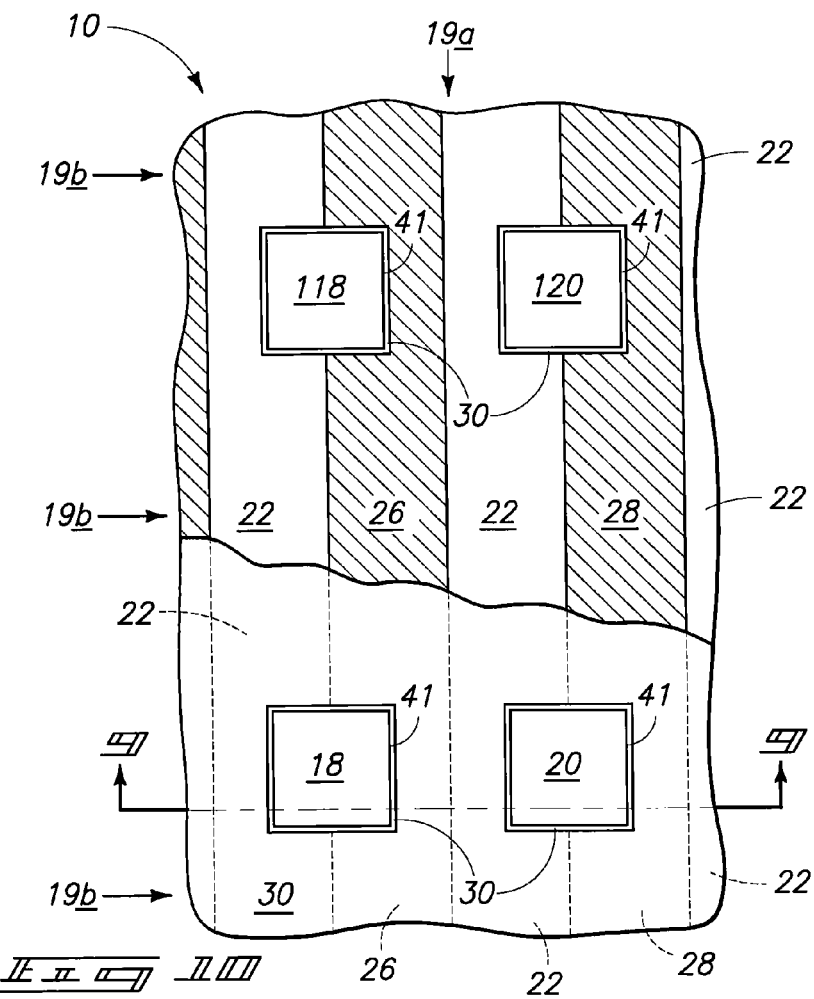

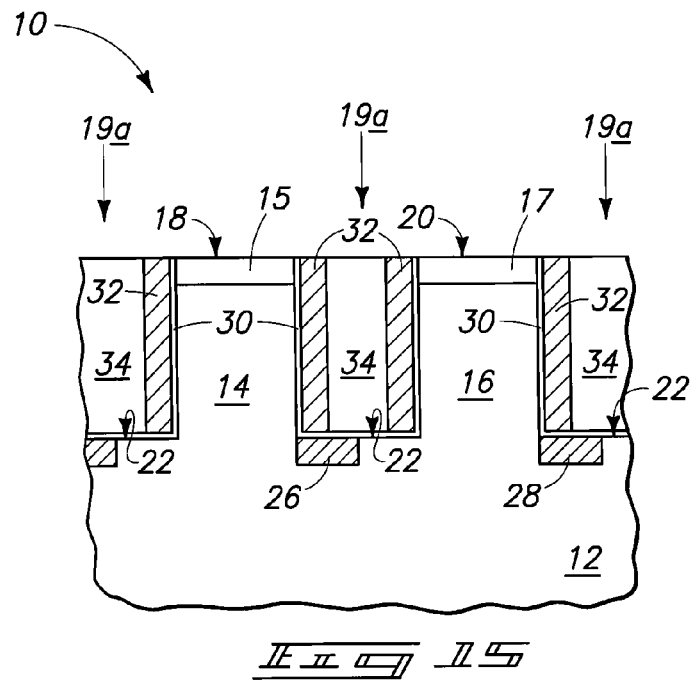
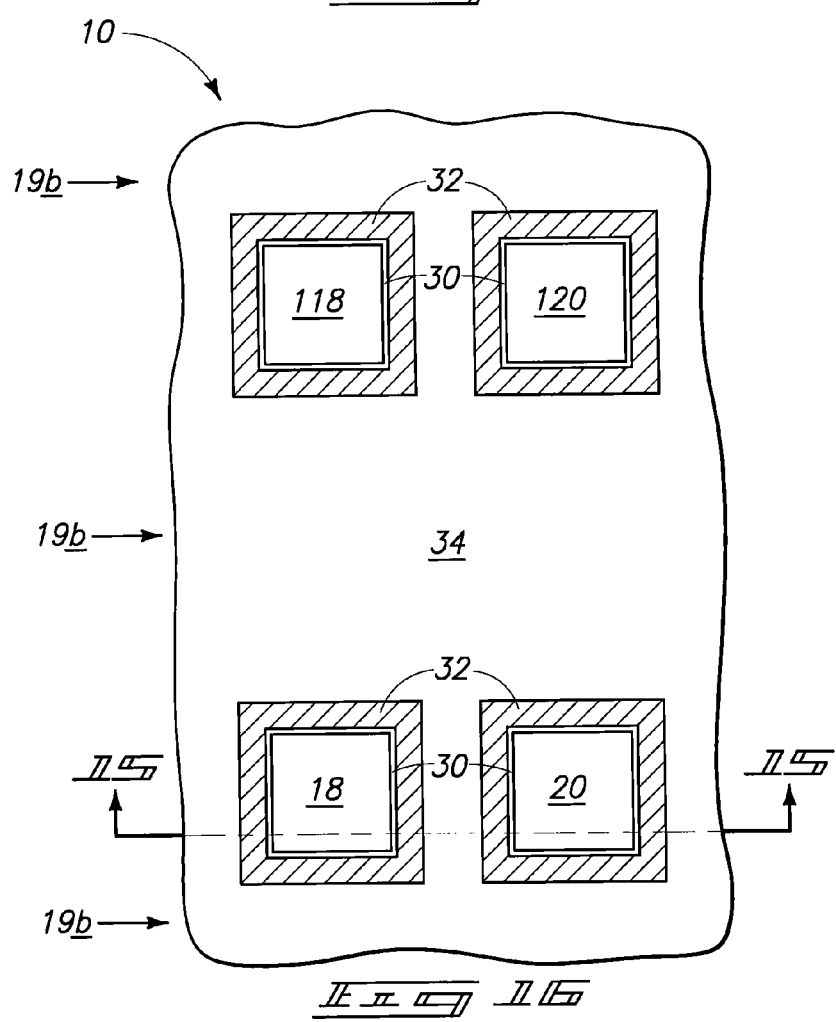

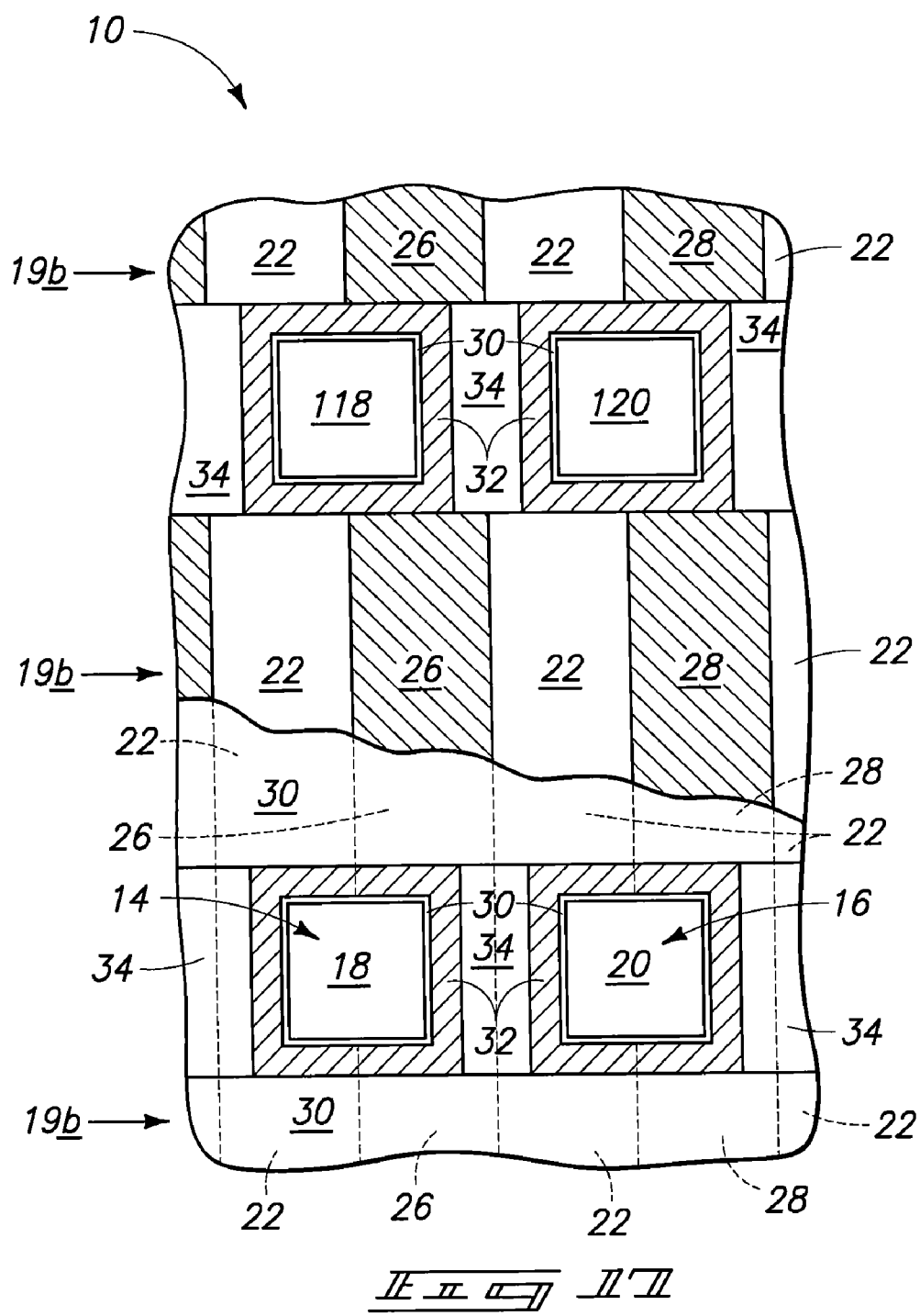

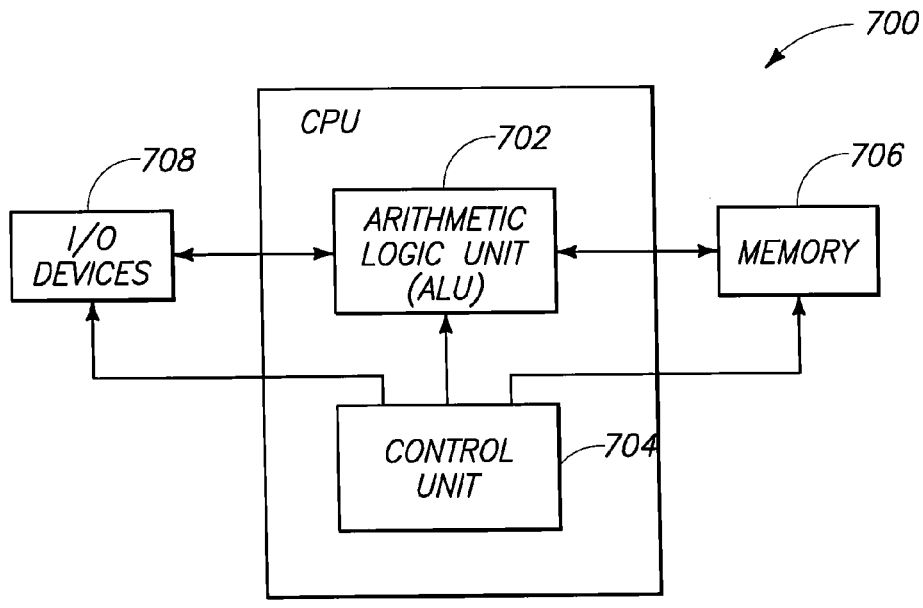
_Fig. 21_
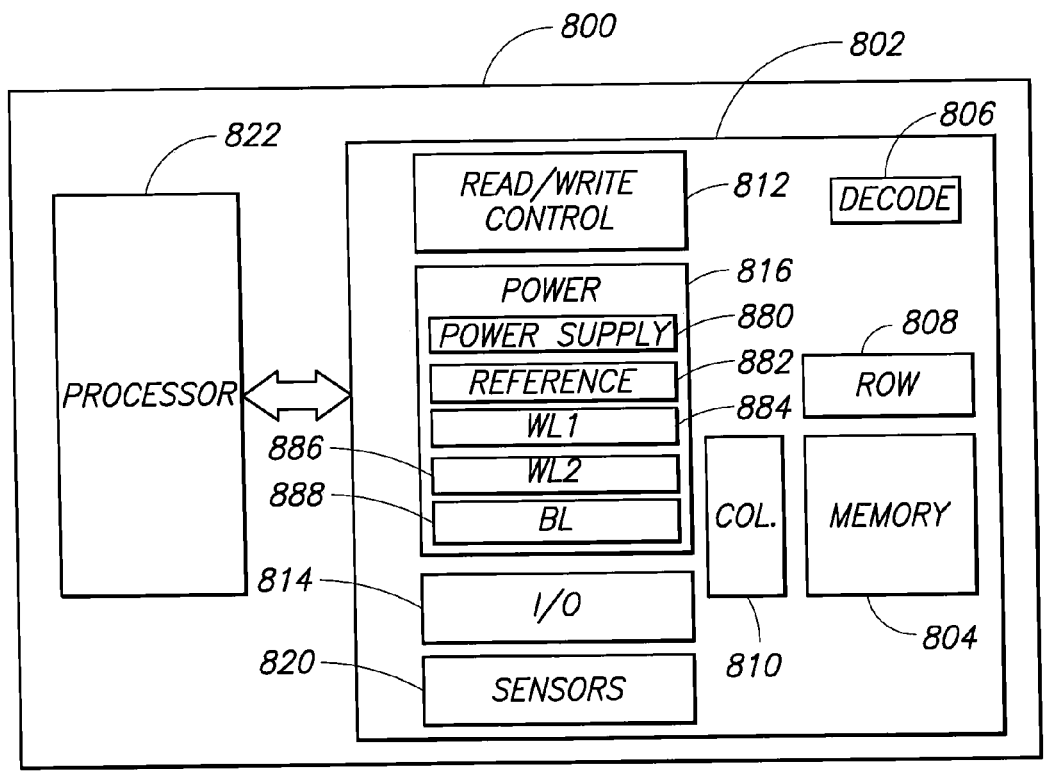
_Fig. 22_ ated with each pillar. The vertical transistor structure comprises a pair of source/drain regions and a channel region between the source/drain regions. One of the source/drain regions is electrically connected with the bit line and another is above the wordline.

US 8,304,818 B2

DRAM ARRAYS, VERTICAL TRANSISTOR STRUCTURES, AND METHODS OF FORMING TRANSISTOR STRUCTURES AND DRAM ARRAYS

RELATED PATENT DATA

This patent resulted from a divisional application of U.S. patent application Ser. No. 11/955,251 which was filed Dec. 12, 2007, which is a continuation of U.S. patent application Ser. No. 11/051,119, filed Feb. 3, 2005, now U.S. Pat. No. 7,326,611.

TECHNICAL FIELD

The invention pertains to semiconductor constructions and methods of forming semiconductor constructions. In particular aspects, the invention pertains to semiconductor constructions having one or more vertical surround gate transistor (SGT) structures and comprising one or more buried bit lines, and pertains to methods of forming such constructions.

BACKGROUND OF THE INVENTION

One continuing goal of semiconductor device application is to increase the level of device integration, or in other words to increase the density of devices across a supporting substrate. Methods for increasing the density can include decreasing the size of individual devices and/or increasing the packing density of the devices (i.e. reducing the amount of space between adjacent devices). In order to develop higher levels of integration it is desirable to develop new device constructions which can be utilized in semiconductor applications and to develop new methods of fabricating semiconductor device constructions.

A relatively common semiconductor device is a memory device with a dynamic random access memory (DRAM) cell being an exemplary memory device. A DRAM cell comprises a transistor and a memory storage device with a typical memory storage device being a capacitor. Modern applications for semiconductor devices can utilize vast numbers of DRAM unit cells.

Transistor structures comprise a channel region between a pair of source/drain regions, and a gate configured to electrically connect the source/drain regions to one another through the channel region. The transistor constructions utilized in semiconductor constructions will be supported by a semiconductor substrate. The semiconductor substrate will have a primary surface which can be considered to define a horizontal direction. Transistor devices can be divided amongst two broad categories based upon the orientations of the channel regions relative to the primary surface of the semiconductor substrate. Specifically, transistor structures which have channel regions that are primarily parallel to the primary surface of the substrate are referred to as planar transistor structures, and those having channel regions which are generally perpendicular to the primary surface of the substrate are referred to as vertical transistor structures. Since current flow between the source and drain regions of a transistor device occurs through the channel region, planar transistor devices can be distinguished from vertical transistor devices based upon the direction of current flow as well as on the general orientation of the channel region. Specifically, vertical transistor devices are devices in which the current flow between the source and drain regions of the devices is primarily substantially orthogonal to a primary surface of a semiconductor substrate, and planar transistor devices are devices in which the current flow between source and drain regions is primarily parallel to the primary surface of the semiconductor substrate.

There is continuing interest in the development of methodologies by which vertical transistor devices can be incorporated into integrated circuitry applications due to, among other things, advantages in packing density that can be obtained utilizing vertical transistor devices relative to planar transistor devices. Vertical transistors can also help alleviate problems associates with leakage current.

Leakage current can be a significant concern and problem in low voltage and low power battery operated circuits and systems and particularly in DRAMs. Where low voltages are used for low power operation there can be a problem with threshold voltages and stand by leakage current. Small threshold voltage magnitudes are utilized to achieve significant overdrive and reasonable switching speeds but can result in large sub-threshold leakage current. Various device structures have been developed to provide some improvement in sub-threshold leakage current characteristics. Many of the developed structures, including vertical transistor structures which can reduce leakage current can be complicated and/or expensive to produce. Difficulties are frequently encountered in attempting to produce the vast arrays of vertical transistor devices desired for semiconductor applications while maintaining suitable performance characteristics of the devices. It would therefore be desirable to develop new semiconductor device constructions applicable for utilization in DRAM structures and to develop new methods for fabricating vertical transistors and DRAM structures.

SUMMARY OF THE INVENTION

In one aspect, the invention encompasses a method of forming a memory array. A semiconductor substrate is provided having a monocrystalline silicon upper surface. Dopant is implanted into the upper surface and a plurality of trenches and a plurality of cross-trenches are etched into the monocrystalline silicon. The cross-trenches are substantially parallel relative to each other and substantially orthogonal relative to the trenches. The trenches and cross-trenches define a plurality of pillars, each of the pillars having a first lateral sidewall intersecting a base surface of a first trench and an opposing second lateral sidewall which intersects a base surface of a second trench. A second dopant is implanted into a base surface of each of the trenches to form a single source/drain region within each trench. The source/drain region extends across the base surface from the first lateral sidewall intersection less than an entirety of a trench width. A layer of gate material is provided around each of the pillars, and the trenches and cross-trenches are filled with an electrically insulative material. At least some of the electrically insulative material within the cross-trenches is replaced with a conductive material.

In one aspect the invention encompasses a method of forming a vertical transistor. A substrate is provided which has a doped upper region containing a first dopant. A pillar is formed having a vertical channel region beneath an upper source/drain region which contains the first dopant. After forming the pillar a second dopant is implanted into the substrate adjacent a bottom of the pillar to form a lower source/drain region.

In one aspect the invention encompasses a semiconductor construction having a bit line disposed within a semiconductor substrate below a first elevation. A wordline is disposed over the substrate which extends elevationally upward from the first elevation and which is substantially orthogonal relative to the bit line. A vertical transistor structure is associated with the wordline, the transistor structure having a channel region which is laterally surrounded by a gate layer. The vertical transistor structure has a plurality of sides including a first side and an opposing second side. The gate layer overlaps the bit line on the first side of the vertical transistor structure. A source/drain region is integral with the bit line and is associated with the first side of the transistor structure. The semiconductor construction has an absence of any source/drain region associated with the second side of the transistor structure.

In one aspect the invention encompasses a memory array having a plurality of substantially parallel bit lines beneath a horizontal elevation of substrate. A plurality of memory cells, each comprising a vertical transistor structure which extends vertically from the horizontal elevation of the substrate, are present in the memory array. Each vertical transistor structure includes a channel region having vertical sidewalls with a gate electrode being disposed along the vertical sidewalls. A drain region is present within a vertically uppermost portion of the channel region and a source region is disposed vertically below the horizontal elevation. The source region is integral with one of the bit lines and is disposed along a first side of the vertical transistor structure. An opposing second side of each transistor structure lacks an associated source/drain region. The memory array includes a plurality of wordlines which extend orthogonal relative to the plurality of bit lines.

BRIEF DESCRIPTION OF THE DRAWINGS

Preferred embodiments of the invention are described below with reference to the following accompanying drawings.

FIGS. 3-4 are a fragmentary cross-sectional side view and a fragmentary top view of a semiconductor construction shown at a processing stage subsequent to that of FIG. 2. The cross-sectional side view of FIG. 3 is along the line 3-3 of FIG. 4.

FIGS. 5-6 are views of the FIGS. 3-4 wafer fragments respectively, shown at a processing stage subsequent to that of FIGS. 3-4. FIG. 5 is a view along the line 5-5 of FIG. 6.

FIGS. 7-8 are views of the fragments of FIGS. 3-4 respectively, shown at a processing stage subsequent to that of FIGS. 5-6. FIG. 7 is a view a long the line 7-7 of FIG. 8.

FIGS. 9-10 are views of the fragments of FIGS. 3-4 respectively, shown at a processing stage subsequent to that of FIGS. 7-8. FIG. 9 is a view along the line 9-9 of FIG. 10.

FIG. 11 is a view along the line 11-11 of FIG. 12.

FIG. 13 is a view along the line 13-13 of FIG. 14.

FIGS. 15-16 are views of the fragments of FIGS. 3-4 respectively, shown at a processing stage subsequent to that of FIGS. 13-14. FIG. 15 is a view along the line 15-15 of FIG. 16.

FIG. 17 is a view of the fragment of FIG. 4 shown at a processing stage subsequent to that of FIG. 16.

FIG. 21 is a high-level block diagram of an electronic system according to an exemplary aspect of the present invention.

FIG. 22 is a simplified block diagram of an exemplary memory device according to an aspect of the present invention.

DETAILED DESCRIPTION OF THE PREFERRED EMBODIMENTS

Figure 1:
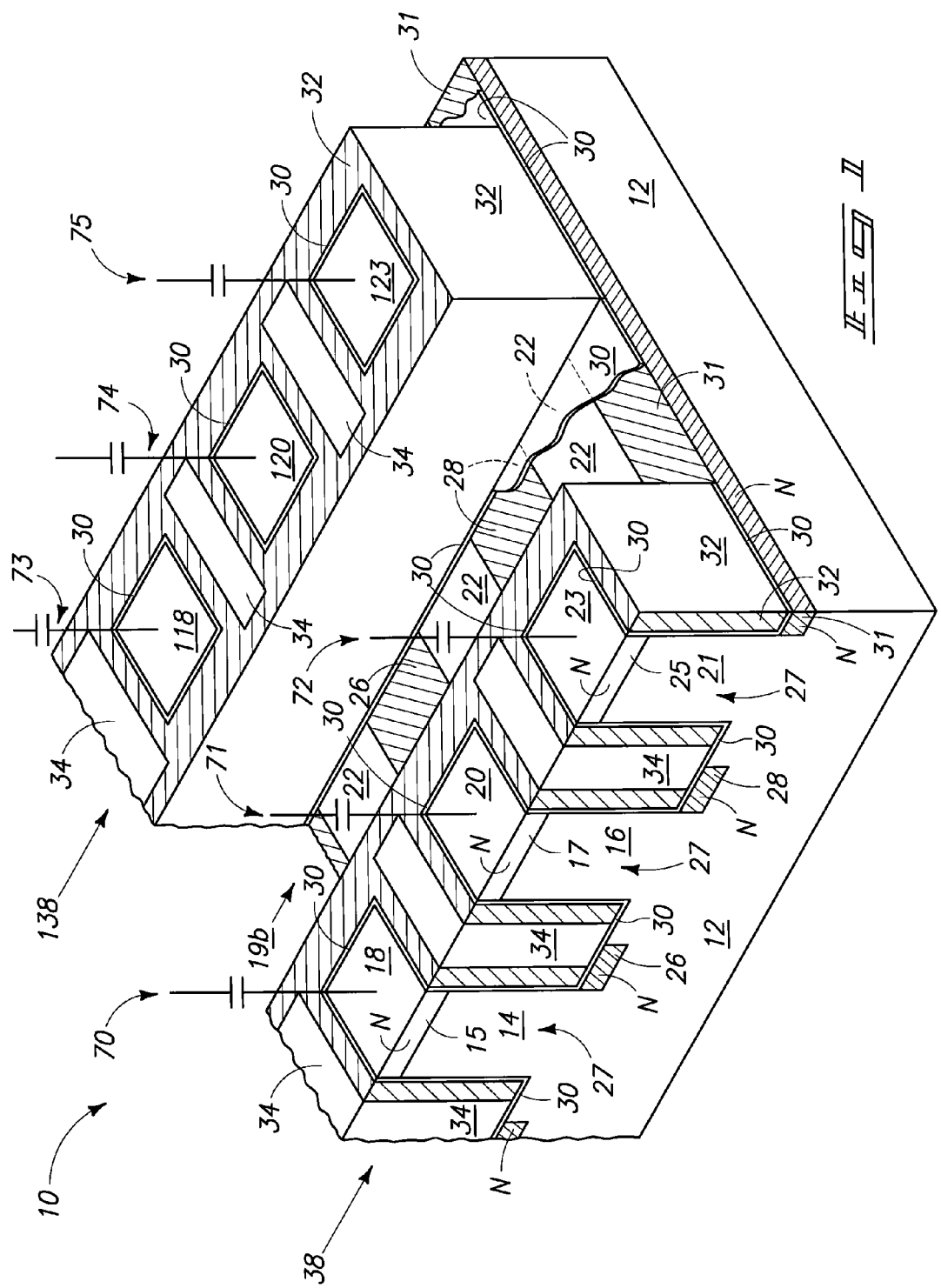
FIG. 1 is a diagrammatic three dimensional view of a fragment of a semiconductor wafer construction illustrating a plurality of vertical surround gate transistor structures formed over a plurality of bit lines in accordance with an exemplary aspect of the present invention.

This disclosure of the invention is submitted in furtherance of the constitutional purposes of the U.S. Patent Laws "to promote the progress of science and useful arts" (Article 1, Section 8).

In particular aspects the invention encompasses dynamic random access memory (DRAM) arrays comprising buried bit lines and vertical surround gate transistors (SGT) which extend partially over the buried bit lines. An exemplary construction 10 is described with references to FIG. 1. Construction 10 comprises a base 12 which can comprise, consist essentially of or consist of appropriately-doped monocrystalline silicon. Base 12 can be referenced to as a semiconductor substrate in the discussion that follows. Alternatively, the term "substrate" can be utilized to refer to combinations of structures such as, for example, combinations of other structures of construction 10 with base 12. To aid in interpretation of the claims that follow, the terms Asemiconductive substrate@ and Asemiconductor substrate@ are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term Asubstrate@ refers to any supporting structure, including, but not limited to, the semiconductive substrates described above.

A plurality of vertically-extending pillars 14, 16 and 21 are shown extending vertically upward from base 12. It is noted that relative elevational relationships are utilized to describe the locations of various features to one another (e.g., upward, downward, etc are utilized) within this disclosure. It is to be understood that such terms are used to express relative relations between the components only, and not to indicate a relationship of the components relative to an external frame of reference. Thus, for example, a feature described herein as projecting upwardly relative to another feature may in fact appear to extend downwardly to a viewer in an external frame of reference relative to the feature.

Vertical pillars can comprise semiconductor material and preferably comprise the monocrystalline silicon of base 12. Each of pillars 14, 16, and 21 are shown to comprise a vertically-extending channel region 27 and an n-type doped region 15, 17 and 25. Pillars 14, 16, and 21 correspondingly comprise upper surfaces 18, 20 and 23, with such upper surfaces alternatively being described as upper surfaces of conductively doped regions 15, 17 and 25. Additional upper surfaces 118, 120 and 123 are shown corresponding to upper surfaces of doped regions of a second plurality of vertically extending pillars comprised by construction 10. The n-type doped regions can correspond to source/drain regions and in particular embodiments will each be a drain region. Although the shown dopant type of the source/drain regions 15, 17 and 25 are n-type, it is to be understood that the dopant can alternatively be p-type in other aspects of the invention (not shown).

In some aspects, base 12 can be considered a semiconductor substrate having an upper surface 22. Such surface can be described as defining a horizontal direction. In such aspects, vertically extending pillars 14, 16 and 21 can be considered to extend upwardly from horizontal upper surface 22 of the semiconductor substrate.

As shown in FIG. 1, a dielectric material 30 extends over substrate 12 and over sidewalls of pillars 14, 16 and 21, as well as sidewalls of each of the second plurality of vertical pillars comprised by construction 10. Dielectric material 30 can preferably completely surround the sidewalls of each vertical pillar. Dielectric material 30 is ultimately utilized for spacing the pillars from a gate material 32, and can comprise any suitable material formed to any suitable thickness. In order to facilitate description of the invention, a portion of material 30 is "cut away" in FIG. 1, as well as in some subsequent figures. Material 30 can, in some instances, remain over portions or all of surface 22 (including regions 26 and 28) between adjacent wordlines.

In particular aspects, dielectric material 30 will comprise, consist essentially of, or consist of silicon dioxide formed to a thickness of less than or equal to about 50 Å. Dielectric material 30 can be formed by, for example, atomic layer deposition or chemical vapor deposition of an appropriate material, by thermal oxidation of exposed surfaces of substrate 12 and/or vertical pillars, or a combination these methods.

A plurality of lower source/drain regions 26, 28 and 31 are provided within substrate 12 proximate the bottom of each of pillars 14, 16 and 21, (and also proximate the bottom of pillars comprised by the second plurality of vertical pillars), where the bottom of a pillar is defined by intersection between the pillar sidewalls and base surface 22. Rather than being disposed substantially centrally beneath a corresponding pillar as typical in most vertical transistors, the lower source/drain regions in accordance with the invention are offset relative to the associated pillar. The transistor structures of the invention can be described as comprising an upper source/drain region vertically over and substantially aligned with a channel region, and comprising a lower source/drain region vertically separated from the upper source/drain region, the lower source/drain region being horizontally offset relative to the channel region (or pillar).

The lower source/drain regions 26, 28 and 31 can comprise any suitable composition and typically will be heavily-doped with a dopant of the same type as utilized in upper source/drain regions 15, 17 and 25. Although lower source/drain regions 26, 28 and 31 are shown as being n-type, it is to be understood that the invention additionally contemplates lower source/drain regions heavily doped with p-type dopant. Conductively doped regions 26, 28 and 31 can alternatively be described as being integral bit lines and source/drain regions. The upper source/drain regions (such as, for example, regions 15, 17 and 25) are typically connected with appropriate charge-storage devices for forming a DRAM construction. In the shown embodiment, upper source/drain regions are connected with capacitor constructions 70, 71, 72, 73, 74 and 75. The capacitor constructions are shown schematically and can comprise any suitable construction.

Gate material 32 can be considered to be formed adjacent the vertical pillars. Gateline material 32 can comprise any suitable composition and typically will comprise, consist essentially of, or consist of conductively-doped semiconductor materials such as, for example, silicon. In particular aspects, gate material 32 can comprise, consist essentially of, or consist of conductively-doped polycrystalline silicon and/or amorphous silicon. Gate material 32 can additionally or alternatively comprise various metals and/or metal compositions. Although, gateline material 32 is shown as homogenous in composition, it is to be understood that the gate material can in some aspects (not shown) comprise two or more separate layers which differ in composition relative to one another.

In a preferred embodiment of the invention, gate material 32 can completely surround each of the vertical pillars of construction 10. In such embodiment, the gate material will overlie a bit line (and integral source/drain region) around only a portion of the lateral perimeter the pillar. The invention additionally contemplates alternative structures (not shown) where material 32 is provided proximate fewer than all of the sidewalls of the vertical pillars. Such alternative constructions can comprise, for example, single-, dual-, or tri-gate vertical transistor structures.

An insulative material 34 can be provided between vertical pillars, and can thereby separate adjacent transistor structures. Insulative material 34 can be, for example, an oxide material such as silicon oxide. Insulative regions 34 can be described as being disposed over surface 22 of base 12, and in the embodiment shown in FIG. 1 can be described as partially overlapping bit lines 26, 28 and 31. Each of insulative regions 34 can be laterally surrounded by gate material 32 and gate material 32 can ultimately be patterned to form wordlines 38 and 138 as shown in FIG. 1.

Alternatively described, construction 10 can be referred to as comprising a memory array having a plurality of substantially parallel bit lines 26, 28 and 31 beneath a horizontal elevation of a substrate. The substantially parallel bit lines can be referred to as being 'buried' bit lines. The memory array includes a plurality of memory cells where each memory cell comprises a vertical transistor structure which extends vertically from the horizontal elevation of the substrate. Each vertical transistor structure includes a channel region 27 having vertical sidewalls and a gate electrode 32 along the vertical sidewalls. Gate electrode 32 is preferably separated from the vertical sidewalls of the channel region by insulative material 30. Each vertical transistor structure additionally includes a corresponding drain region 15, 17, 25 within a vertically uppermost portion of the channel region. A source region of each vertical transistor is disposed vertically below the horizontal elevation (26, 28 and 31). The source regions can be integral with one of the bit lines.

As shown in FIG. 10, each transistor structure can be associated with a single bit line such that the associated bit line is disposed partially beneath a first side of the transistor structure (having the electrode material and gate oxide disposed over the bitline along the first side). The opposing second side of each transistor structure lacks a corresponding associated bit line and source/drain region.

In the embodiment shown in FIG. 1, a plurality of wordlines including wordlines 38 and 131 extend orthogonal relative to the plurality of bit lines. A trench 19b spatially separates adjacent wordlines 38 and 138. Although not shown in the diagram of FIG. 1, there would typically be one or more insulative materials formed over wordlines 38 and 138, and over upper surfaces of the vertical pillars 18, 20, 23, 118, 120 and 123. Adjacent vertical transistor structures within a wordline are separated from one another by insulative regions 34.

Although construction 10 in FIG. 1 is shown as having trench 19b as being an opening between wordlines 38 and 138, it is to be understood that an electrically insulative line (not shown) or alternative structure can be provided to extend between wordlines 38 and 138. In some instances, where oxide material 30 extends over surface 22 within trench 19b, the electrically insulative line will be formed over material 30. Where an electrically insulative line is present within trench 19b, such can electrically isolate the wordlines from one another. The line can extend over surface 22 and bit lines 26, 28 and 31. An appropriate material for formation of an insulative line within trench 19b can comprise, for example, silicon dioxide or borophosphosilicate glass (BPSG).

The wordlines 38 and 138 can be considered to comprise transistor gate structures which gatedly connect the source/drain regions of the vertically extending pillars through the channel regions. For instance, wordline 38 can be considered to comprise a gate which gatedly connects source/drain regions 26 and 15 to one another through channel region 27 associated with pillar 14. In particular aspects, the transistor gate structures, capacitor structures, source/drain drain regions and channel regions can be considered to comprise DRAM unit cells. For instance, the capacitor 70 together with diffusion regions 15, 26 and 27 (associated with pillar 14) and transistor gate material 32 comprised by wordline 38 can be considered to form a DRAM unit cell. The DRAM unit cells can be incorporated into a DRAM array which can be incorporated into an electronic device.

The DRAM unit cells can correspond to $4F^2$ constructions in some aspects of the invention. In particular aspects of the invention at least a portion of a DRAM unit cell comprising a transistor gate from a wordline (such as, for example, wordline 38) together with the source/drain and channel regions of the vertically-extending pillar surrounded by the wordline will correspond to a $4F^2$ construction. In other words, at least a portion of the DRAM unit cell exclusive of the capacitor will correspond to a $4F^2$ construction. The capacitor may also be included with in the $4F^2$ construction or in other aspects the capacitor may comprise a configuration such that the capacitor does not fit within a $4F^2$ construction.

Although the invention is described in FIG. 1 with reference to a DRAM construction, it is to be understood that the invention can have application to other constructions including, for example, constructions associated with display applications, micro-electro-mechanical systems (MEMS), matrix applications, etc.

Exemplary methodology for forming the construction of FIG. 1 is described with references to FIGS. 2-18. Similar numbering will be used to describe FIGS. 2-18 as was used in describing FIG. 1 where appropriate.

Figure 2:
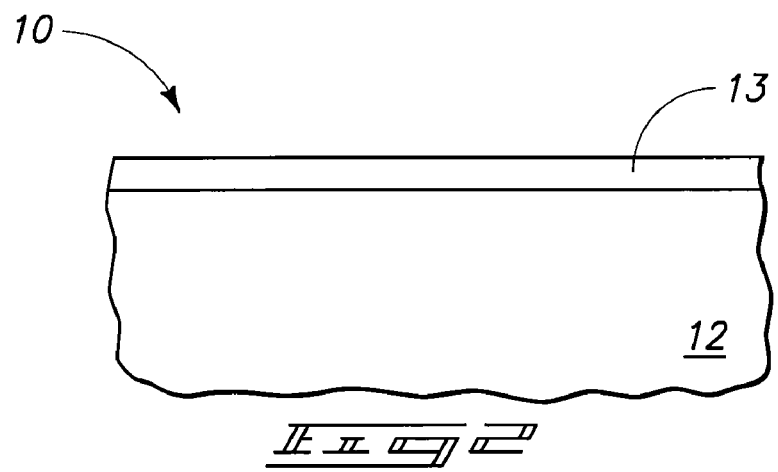
FIG. 2 is a fragmentary cross-sectional side view of a semiconductor construction at a preliminary processing stage of an exemplary aspect of the present invention.

Referring initially to FIG. 2, such illustrates a semiconductor structure in cross-sectional view. Construction 10 comprises semiconductor base 12 which comprises a semiconductor material. Preferably the semiconductor material of base 12 is monocrystalline silicon and is doped with an appropriate dopant. In particular embodiments the monocrystalline silicon of base 12 is doped with a p-type dopant. An upper portion 13 of base 12 is doped to form a doped region which can preferably be heavily doped with an n-type dopant. Doping of the upper surface region of base 12 can comprise, for example implanting a first dopant to form region 13.

Figure 3:
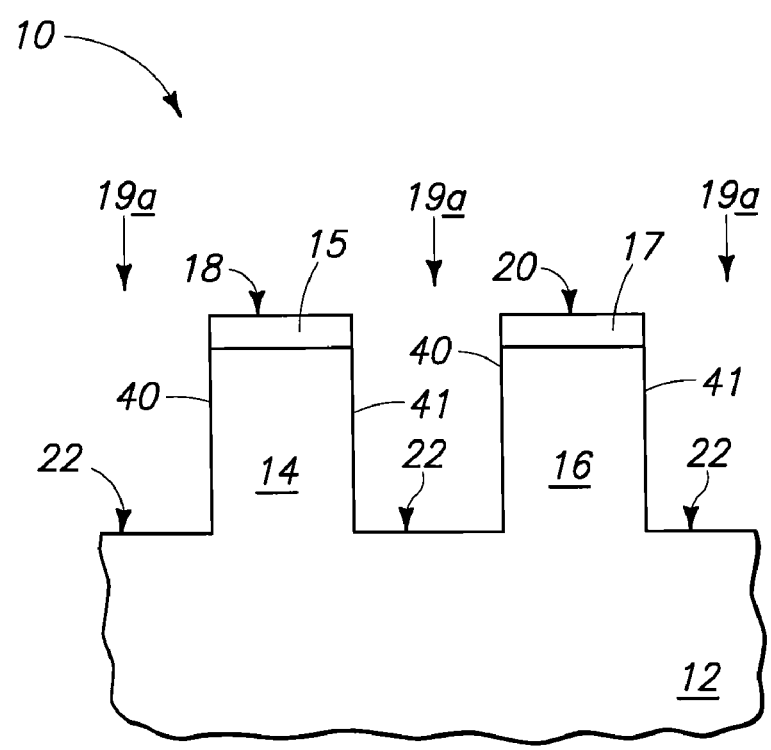

Referring to FIG. 3, substrate 12 is etched to form a plurality of trenches 19a and a plurality of pillars 14 and 16. Trenches 19a comprise base surfaces 22 disposed between adjacent pillars. The pillars shown in FIG. 3 can be referred to as a first pillar 14 and a second pillar 16. First pillar 14 comprises opposing lateral sidewalls 40 and 41 and an upper surface 18. The uppermost portion 15 of pillar 14 which is doped with the first dopant can be referred to as a doped region, or source/drain region. The lateral sidewalls can be described as intersecting base surface 22, where first lateral sidewall 40 intersects base 22 within a first trench, and opposing second lateral sidewall intersects base surface 22 within a second trench. Second pillar 16 similarly comprises opposing lateral sidewalls 40 and 41 and an uppermost region 17 which has a doped upper surface 20.

Referring to FIG. 4, such shows a top view of the structure depicted in FIG. 3. During the etching of the substrate discussed above, trenches 19a are formed to be substantially parallel with respect to each other. A plurality of cross-trenches 19b is additionally formed during the etching step such that the cross-trenches are substantially orthogonal relative to trenches 19a. Accordingly, each of pillars 14, 16, 114 and 116 have lateral sidewalls 40, 41, 42 and 43 defined by the etched trenches and cross-trenches. Each of the pillars can be described as having a first sidewall 40 and an opposing second sidewall 41; and as having a front sidewall 42 and an opposing back sidewall 43.

Formation of trenches 19a and cross-trenches 19b exposes base surface 22 at the base of each trench and between adjacent pillars. For purposes of the present description, base surface 22 can be referred to as being disposed at and defining a horizontal elevation of the substrate. Accordingly, each of the pillars can be described as extending vertically upward from the horizontal elevation.

Referring next to FIGS. 5-6, a layer of masking material 24 is formed over the pillars and within trenches 19a and 19b, and is subsequently patterned to expose a first portion of base surface 22 within each of trenches 19a. As shown in FIGS. 5 and 6, such patterning can additionally expose a portion of each of the pillars. Preferably such patterning retains a portion of material 24 over at least a portion of each of the vertical pillars and blocks a second portion of surface 22 within each of the trenches 19a. In other words, after patterning mask material 24 a first side of each conductive pillar and the adjacent substrate material within a first trench is covered, while a second side of each pillar and the substrate material adjacent the second side within a second trench is exposed. In FIG. 6, the covered portion of each of pillars 14, 16, 114 and 116 are shown in dashed views. Appropriate materials and methodology to achieve the described patterned mask are known to those skilled in the art.

Referring next to FIGS. 7 and 8, a second dopant is implanted into the exposed regions of each of trenches 19a and the masking material (24 of FIGS. 5 and 6) is removed. A appropriate anneal can be performed after implanting the second dopant, either at the stage of processing shown in FIGS. 7 and 8, or at a subsequent processing stage. The implanted dopant forms doped regions 26 and 28 within base material 12 with such doped regions being beneath horizontal elevation defined by surface 22. Doped regions 26 and 28 can be described as being lower source/drain regions associated with corresponding pillars 14 and 16 and also as being bit lines having integral source/drain regions along trenches 19a. The bit lines extend less than an entirely of the width of the trenches due to the presence of the patterned mask during implanting. The part of trenches 19a which is protected during the implanting of the second dopant preferably remains substantially free of the second dopant.

Each of pillars 14 and 16 comprises a channel region disposed intermediate horizontal elevation 22 and an upper doped region 15, 17 corresponding to an upper source/drain region. In particular embodiments, lower source/drain regions 26 will be source regions which are vertically separated from drain regions 15 and 17 by channel regions 27.

As shown in FIG. 8, integral bit line source/drain regions 26 and 28 are formed to be substantially parallel relative to each other, and to each be disposed along one side of a plurality of pillars. Accordingly, the bit lines are disposed substantially orthogonal relative to cross-trenches 19b. Preferably, source/drain regions 26 and 28 are formed to extend partially along front side 42 and partially along back side 43 of each pillar, but do not extend the entire width of the pillar. Each of the vertical pillars is associated with a single bit line along one side 41 and can therefore be described as having an absence of source/drain region and/or bit line on an opposing side 40 of the pillar.

Referring next to FIGS. 9-10, after formation of the bit lines and associated source/drain regions, a dielectric material 30 is formed over the substrate and over at least a portion of the vertical sidewalls of each of the pillars. Dielectric material 30 can be formed by, for example, atomic layer deposition or chemical vapor deposition of an appropriate material (described above) or can be formed by thermal oxidation of exposed surfaces of substrate 12 and the vertical pillars.

In particular aspects, dielectric material 30 will be provided to completely surround each of the pillars for utilization as a gate oxide in vertical transistor structures having surrounding gates. A first portion of the gate oxide adjacent a given pillar can overlap the bit line on one side of the transistor structure. A second portion of the gate oxide adjacent an opposing side of the given pillar can overlie a portion of surface 22 which is substantially free of the second dopant (along the side of the pillar opposing the bit line). The oxide material 30 can, in some aspects overlie the bitline along a portion of the front side and/or a portion of the back side of the pillar. Referring to FIG. 10, such shows a portion of material 30 cut away to allow visualization of underlying features, as discussed above. It is to be understood that the dielectric material can cover a portion or all of the surface regions (22, 26, 28) between transistor devices. In addition to the depicted surrounding gate transistor structures, the invention contemplates adaptation for utilization of single gated, dual gated or tri-gated vertical transistor structures.

Figure 11:
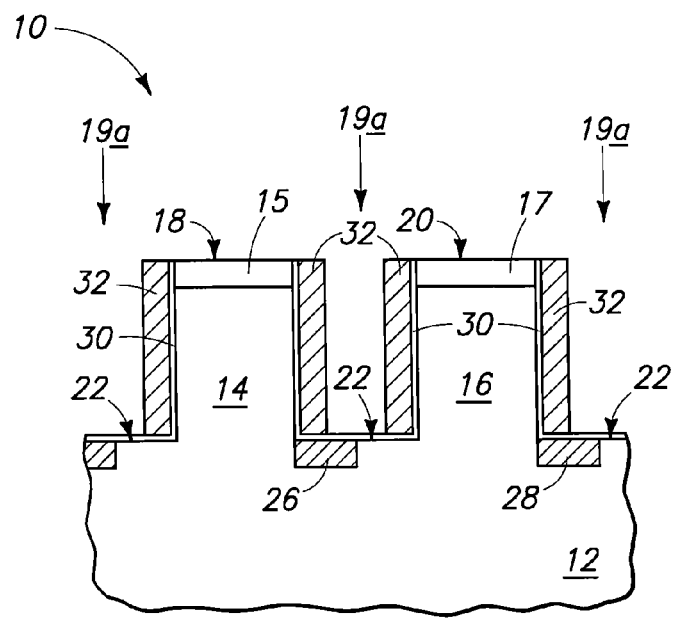
FIGS. 11-12 are views of the fragments of FIGS. 3-4 respectively, shown at a processing stage subsequent to that of FIGS. 9-10.
Figure 12:
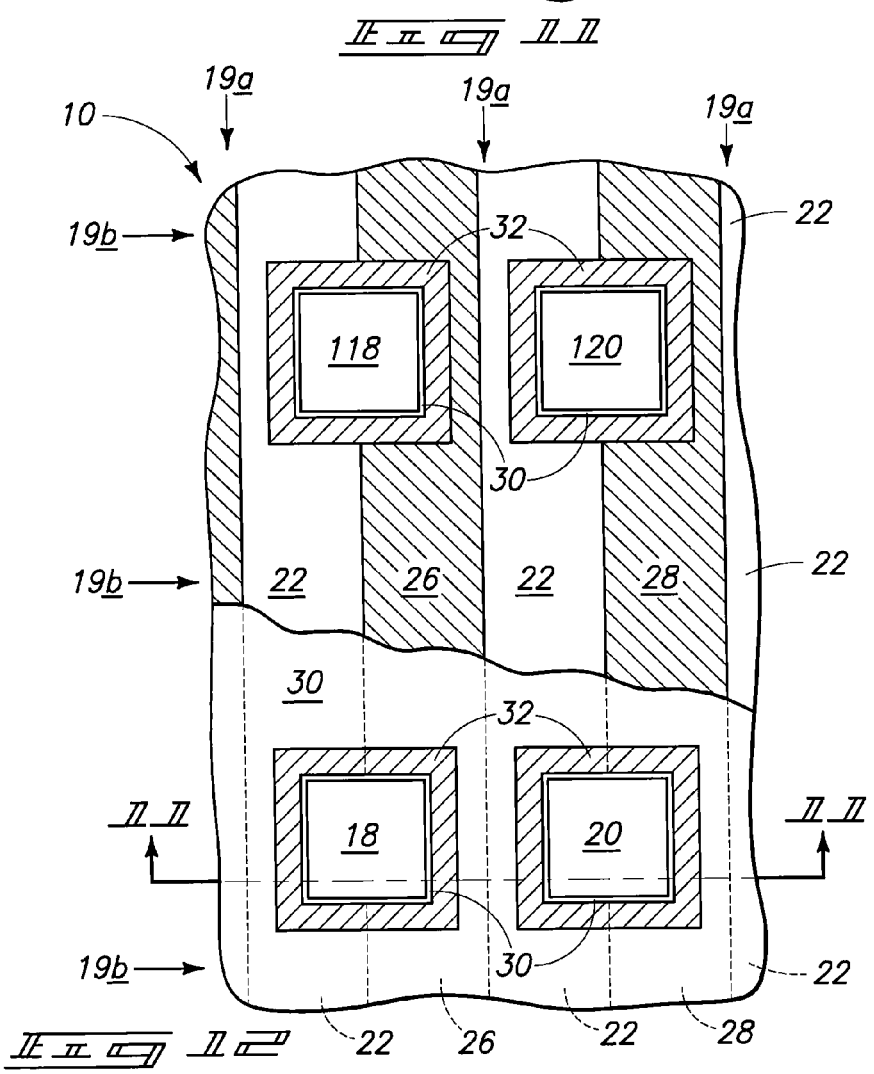

Referring next to FIGS. 11-12, after formation of the gate oxides 30, a gate layer can be formed around, and preferably completely surrounding, the entire sidewall periphery of each of vertical pillar. Formation of the gate layer can comprise deposition of an appropriate gate/electrode material over base 12 and within channels 19a and cross channels 19b, followed by a directional etch. In particular embodiments of the invention, material 32 can preferably comprise polysilicon. Alternative or additional materials which can be utilized for gate layer 32 include, for example metallic materials including but not limited to aluminum and conductive metallic nitrides.

Figure 13:
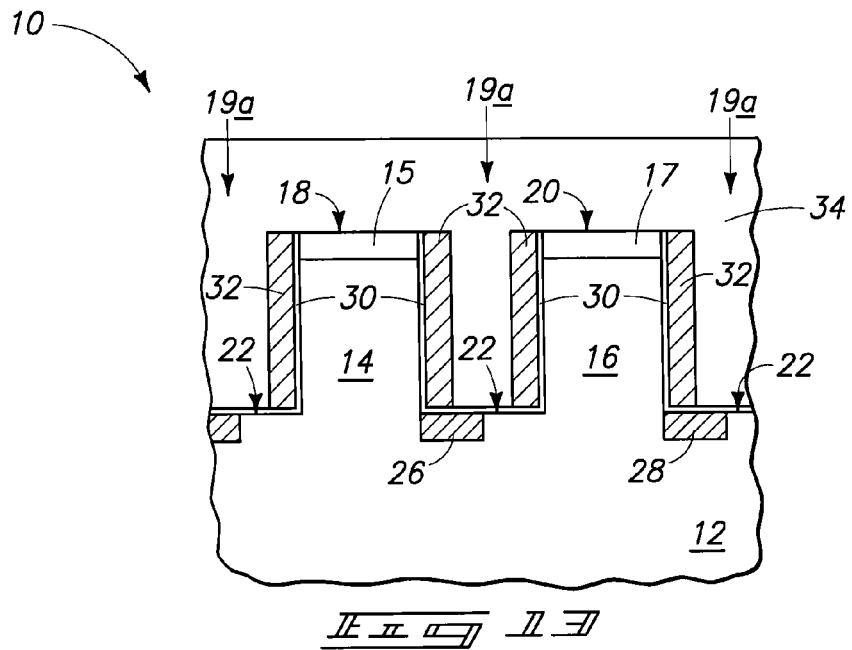
FIGS. 13-14 are views of the fragments of FIGS. 3-4 respectively, shown at a processing stage subsequent to that of FIGS. 11-12.
Figure 14:
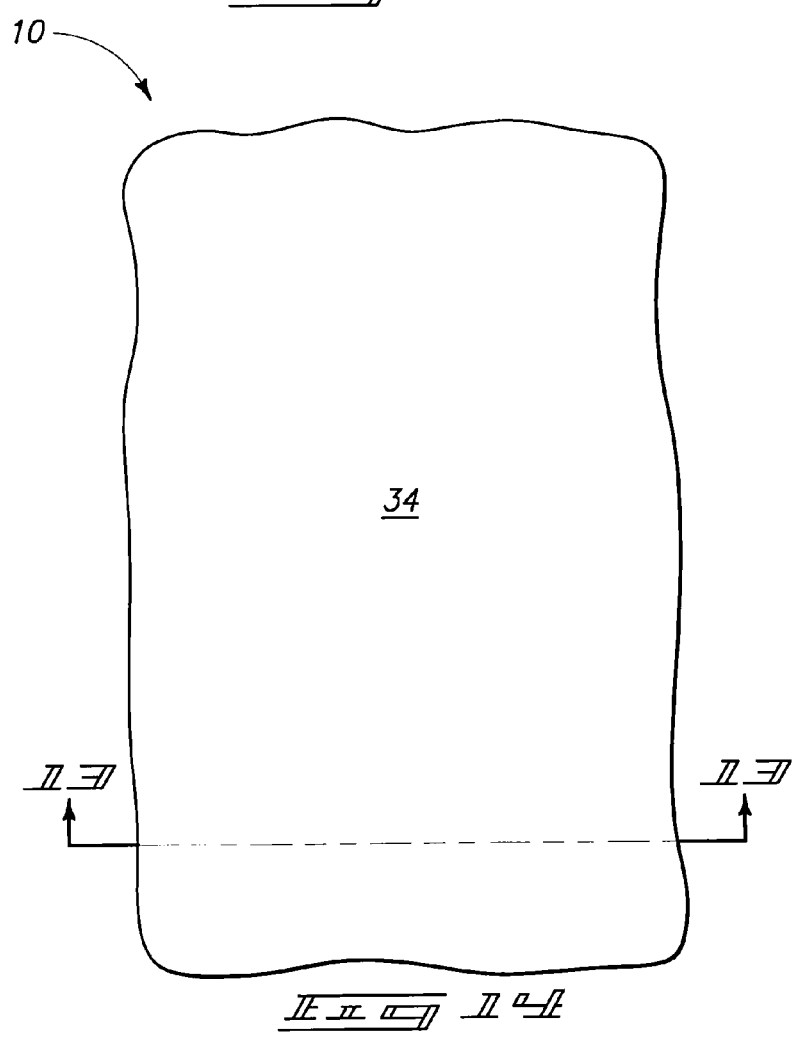

Referring to FIGS. 13-14, after formation of surrounding gate material 32, structure 10 is completely filled with a dielectric material 34. Material 34 can comprise an oxide material such as, for example, silicon oxide.

Referring to FIGS. 15 and 16, oxide material 34 can be planarized by, for example, chemical mechanical polishing (CMP). Such planarization can preferably expose upper surfaces 18, 20, 118 and 120 of the corresponding pillars comprised by each device structure. As shown in FIG. 15, a transistor device structure comprising a single pillar, the associated gate oxide and the associated surrounding gate can be formed such that the surrounding gate overlaps a bit line on one side of the device and does not overlap a bit line on an opposing side of the device. Oxide material 34 can also overlap a portion of a bit line between adjacent transistor devices.

Referring next to FIG. 17, openings are formed into oxide material 34 by removal of at least some of the oxide material from within cross-trench regions 19b. Oxide removal can be achieved by any appropriate method such as, for example, masking and etching techniques. Such openings can be substantially orthogonal relative to the plurality of bit lines. Although such openings can be formed to expose an upper surface of the bit lines, the formation of openings preferably leaves a thin layer of insulative oxide material (i.e. material 30) over upper surface of the bit lines and base surface 22. As shown in FIG. 17, formation of openings within the oxide material can expose surrounding gate electrodes 32 along the front and back sides of each of the conductive pillars while retaining oxide regions 34 between the first side of a particular pillar (i.e. pillar 14) and a second side of an adjacent pillar (i.e. pillar 16).

Figure 18:
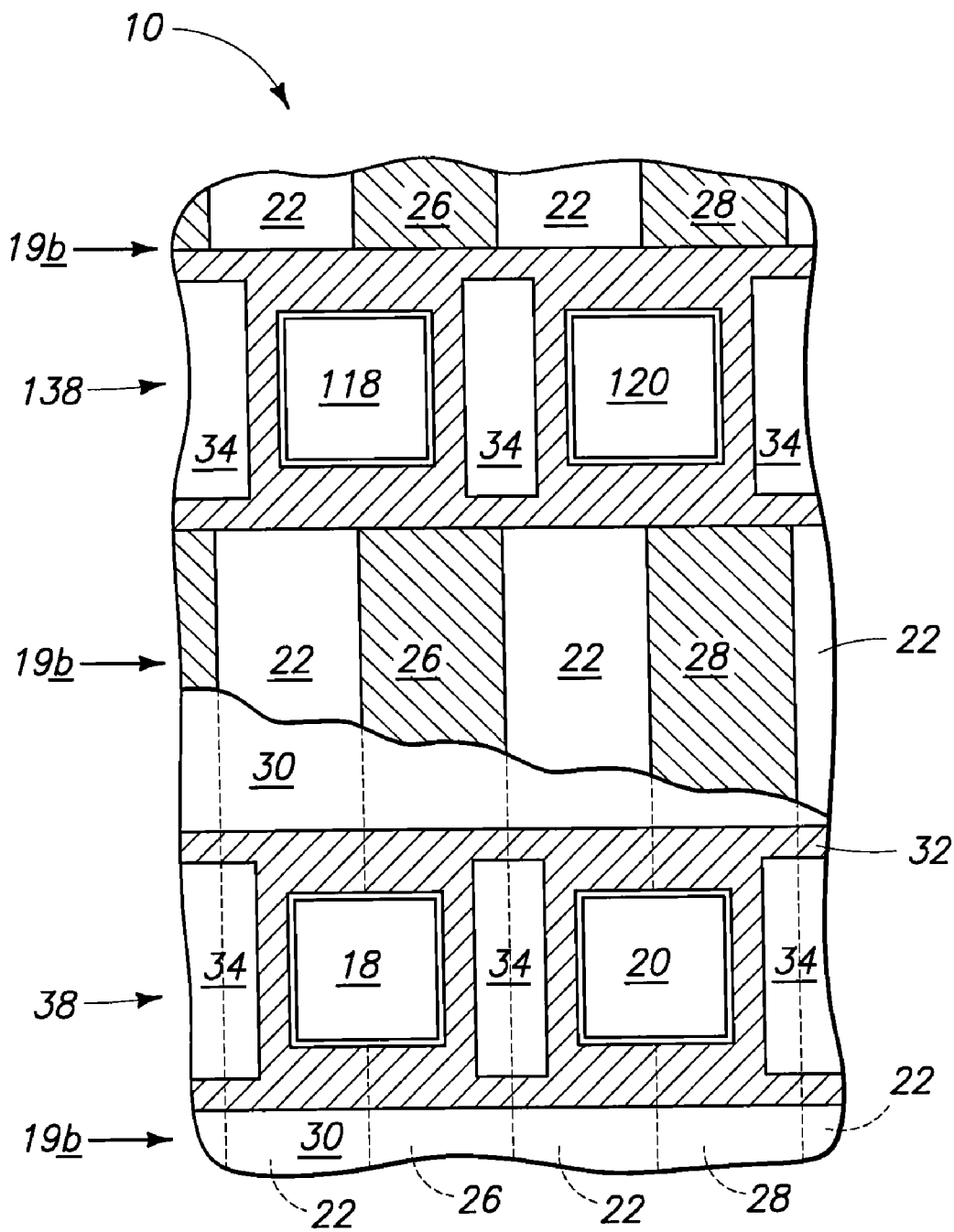
FIG. 18 is a view of the fragment of FIG. 4 shown at a processing stage subsequent to that of FIG. 17.

Referring to FIG. 18, additional gate material 32 and/or one or more alternative material (not shown) can be deposited within the openings within material 34 in place of at least some of the material 34 removed during opening formation. Exemplary alternative materials can include for example, polysilicon or metallic materials including but not limited to aluminum and/or conductive nitrides. The deposited additional gate material can be directionally etched to form wordlines 38 and 138 which run substantially orthogonal relative to the buried bit lines. Each of wordlines 38 and 138 can be described as comprising transistor structures having vertical pillars which are offset relative to buried bit lines. Each transistor structure comprises a vertical channel region associated with a single bit line. The resulting vertical transistor device structure can be produced such that the offset bit line associated with the transistor structure is in electrical communication with a first side of the device while a second side of the device is not disposed over a bit line or source/drain region.

Constructions in accordance with the invention can be advantageous since the described structures and vertical transistors can be formed without epitaxial growth of the vertical pillars. Since epitaxial growth can be difficult and/or expensive, the described formation of etched silicon pillars can allow production of vertical transistors without prohibitively expensive or problematic processing. This processing can allow cost effective production of SGTs for enhanced or maximization of control of the channel region and alleviation of current leakage problems.

Figure 19:
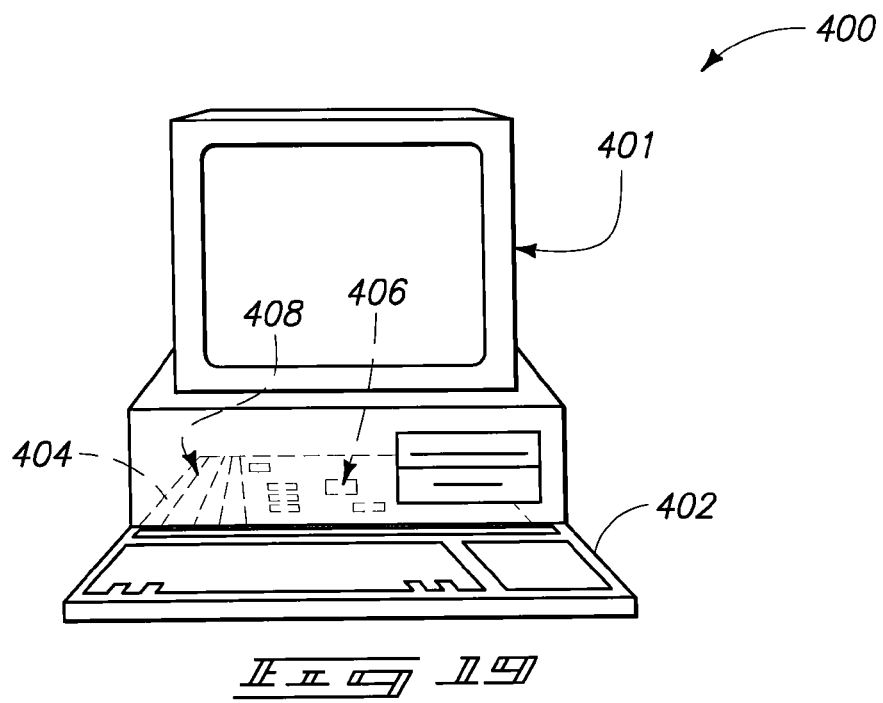
FIG. 19 is a diagrammatic view of a computer illustrating an exemplary application of the present invention.
Figure 20:
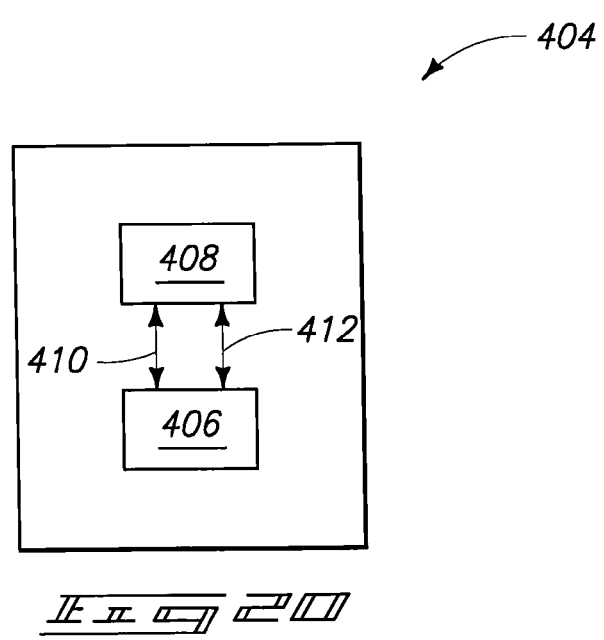
FIG. 20 is a block diagram showing particular features of the motherboard of the FIG. 19 computer.

FIG. 19 illustrates generally, by way of example but not by way of limitation, an embodiment of a computer system 400 according to an aspect of the present invention. Computer system 400 includes a monitor 401 or other communication output device, a keyboard 402 or other communication input device, and a motherboard 404. Motherboard 404 can carry a microprocessor 406 or other data processing unit, and at least one memory device 408. Memory device 408 can comprise various aspects of the invention described above. Memory device 408 can comprise an array of memory cells, and such array can be coupled with addressing circuitry for accessing individual memory cells in the array. Further, the memory cell array can be coupled to a read circuit for reading data from the memory cells. The addressing and read circuitry can be utilized for conveying information between memory device 408 and processor 406. Such is illustrated in the block diagram of the motherboard 404 shown in FIG. 20. In such block diagram, the addressing circuitry is illustrated as 410 and the read circuitry is illustrated as 412. Various components of computer system 400, including processor 406, can comprise one or more of the memory constructions described previously in this disclosure.

Processor device 406 can correspond to a processor module, and associated memory utilized with the module can comprise teachings of the present invention.

Memory device 408 can correspond to a memory module. For example, single in-line memory modules (SIMMs) and dual in-line memory modules (DIMMs) may be used in the implementation which utilize the teachings of the present invention. The memory device can be incorporated into any of a variety of designs which provide different methods of reading from and writing to memory cells of the device. One such method is the page mode operation. Page mode operations in a DRAM are defined by the method of accessing a row of a memory cell arrays and randomly accessing different columns of the array. Data stored at the row and column intersection can be read and output while that column is accessed.

An alternate type of device is the extended data output (EDO) memory which allows data stored at a memory array address to be available as output after the addressed column has been closed. This memory can increase some communication speeds by allowing shorter access signals without reducing the time in which memory output data is available on a memory bus. Other alternative types of devices include SDRAM, DDR SDRAM, SLDRAM, VRAM and Direct RDRAM, as well as others such as SRAM or Flash memories.

Memory device 408 can comprise memory formed in accordance with one or more aspects of the present invention.

FIG. 21 illustrates a simplified block diagram of a high-level organization of various embodiments of an exemplary electronic system 700 of the present invention. System 700 can correspond to, for example, a computer system, a process control system, or any other system that employs a processor and associated memory. Electronic system 700 has functional elements, including a processor or arithmetic/logic unit (ALU) 702, a control unit 704, a memory device unit 706 and an input/output (I/O) device 708. Generally, electronic system 700 will have a native set of instructions that specify operations to be performed on data by the processor 702 and other interactions between the processor 702, the memory device unit 706 and the I/O devices 708. The control unit 704 coordinates all operations of the processor 702, the memory device 706 and the I/O devices 708 by continuously cycling through a set of operations that cause instructions to be fetched from the memory device 706 and executed. In various embodiments, the memory device 706 includes, but is not limited to, random access memory (RAM) devices, read-only memory (ROM) devices, and peripheral devices such as a floppy disk drive and a compact disk CD-ROM drive. One of ordinary skill in the art will understand, upon reading and comprehending this disclosure, that any of the illustrated electrical components are capable of being fabricated to include memory constructions in accordance with various aspects of the present invention.

FIG. 22 is a simplified block diagram of a high-level organization of various embodiments of an exemplary electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing the first wordline with pulses, circuitry 886 for providing the second wordline with pulses, and circuitry 888 for providing the bit line with pulses. The system 800 also includes a processor 822, or memory controller for memory accessing.

The memory device 802 receives control signals from the processor 822 over wiring or metallization lines. The memory device 802 is used to store data which is accessed via I/O lines. It will be appreciated by those skilled in the art that additional circuitry and control signals can be provided, and that the memory device 802 has been simplified to help focus on the invention. At least one of the processor 822 or memory device 802 can include a memory construction of the type described previously in this disclosure.

The various illustrated systems of this disclosure are intended to provide a general understanding of various applications for the circuitry and structures of the present invention, and are not intended to serve as a complete description of all the elements and features of an electronic system using memory cells in accordance with aspects of the present invention. One of the ordinary skill in the art will understand that the various electronic systems can be fabricated in single-package processing units, or even on a single semiconductor chip, in order to reduce the communication time between the processor and the memory device(s).

Applications for memory cells can include electronic systems for use in memory modules, device drivers, power modules, communication modems, processor modules, and application-specific modules, and may include multilayer, multi-chip modules. Such circuitry can further be a subcomponent of a variety of electronic systems, such as a clock, a television, a cell phone, a personal computer, an automobile, an industrial control system, an aircraft, and others.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A memory array comprising:
a plurality of substantially parallel bit lines beneath a horizontal elevation of a substrate, a plurality of memory cells, each memory cell comprising a vertical transistor structure extending vertically from the horizontal elevation of the substrate, each of the vertical transistor structures comprising:
a channel region having vertical sidewalls;
a gate electrode along the vertical sidewalls;
a drain region within a vertically-uppermost portion of the channel region; and
a source region disposed vertically below the horizontal elevation, the source region being integral with one of the bit lines and disposed along a first side of the channel region of the vertical transistor structure, an opposing second side of the channel region of each transistor structure lacking an associated source region; and
a plurality of wordlines extending orthogonally relative to the plurality of bit lines.

2. The memory array of claim 1 wherein the gate electrode surrounds the channel region.

3. The memory array of claim 1 wherein the electrode is separated from the channel region by an oxide material.

4. The memory array of claim 1 wherein the channel region comprises monocrystalline silicon.

5. The memory array of claim 1 wherein the drain region is electrically connected to a capacitor.

6. A DRAM array comprising a plurality of vertical transistor devices, each of the transistor devices comprising a vertical channel region which is horizontally offset relative to a buried bitline such that the buried bitline extends beneath a first side of the channel but does not extend to an opposing second side of the channel, the second side being free of any associated bitline.

* * * * *

UNITED STATES PATENT AND TRADEMARK OFFICE
CERTIFICATE OF CORRECTION

PATENT NO. : 8,304,818 B2  
APPLICATION NO. : 12/899436  
DATED : November 6, 2012  
INVENTOR(S) : Leonard Forbes Page 1 of 1

It is certified that error appears in the above-identified patent and that said Letters Patent is hereby corrected as shown below:

On the face page, in field (62), under "Related U.S. Application Data", in column 1, line 2, delete "7,824,982." and insert -- 7,824,982, which is a continuation of U.S. Patent Application Ser. No. 11/051,119, filed Feb. 3, 2005, now U.S. Pat. No. 7,326,611. --, therefor.

Signed and Sealed this
Twelfth Day of February, 2013

Teresa Stanek Rea
*Acting Director of the United States Patent and Trademark Office*